(12) United States Patent
Wang et al.

(10) Patent No.: US 11,542,589 B2
(45) Date of Patent: Jan. 3, 2023

(54) RESISTANCE-AREA (RA) CONTROL IN LAYERS DEPOSITED IN PHYSICAL VAPOR DEPOSITION CHAMBER

(71) Applicant: APPLIED MATERIALS, INC., Santa Clara, CA (US)

(72) Inventors: Rongjun Wang, Dublin, CA (US); Xiaodong Wang, San Jose, CA (US); Chao Du, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 558 days.

(21) Appl. No.: 16/358,465

(22) Filed: Mar. 19, 2019

(65) Prior Publication Data
US 2019/0292651 A1 Sep. 26, 2019

Related U.S. Application Data

(60) Provisional application No. 62/646,186, filed on Mar. 21, 2018.

(51) Int. Cl.
*C23C 14/14* (2006.01)
*C23C 14/34* (2006.01)

(52) U.S. Cl.
CPC .......... *C23C 14/14* (2013.01); *C23C 14/3407* (2013.01)

(58) Field of Classification Search
CPC ..... C23C 14/14; C23C 14/34; C23C 14/3407; C23C 14/3492; C23C 16/30; C23C 16/40;
(Continued)

(56) References Cited

U.S. PATENT DOCUMENTS 6,042,700 A 3/2000 Gopalraja et al.
6,449,525 B1 9/2002 Liu et al.
(Continued)

FOREIGN PATENT DOCUMENTS

WO WO 2009-085157 A1 7/2009

OTHER PUBLICATIONS

J.M. Slaughter, E.Y. Chen, R. Whig, B.N. Engel, J. Janesky, and S. Tehrani. Magnetic Tunnel Junction Materials for Electronic Applications. 2000, Journal of The Minerals, Metals & Materials Society, https://www.tms.org/pubs/journals/JOM/0006/Slaughter/Slaughter-0006.html?ref=driverlayer.com (Year: 2000).*

(Continued)

*Primary Examiner* — Jennifer Wecker
*Assistant Examiner* — Patrick S Ott
(74) *Attorney, Agent, or Firm* — Moser Taboada (57) ABSTRACT

Methods for depositing a dielectric oxide layer atop one or more substrates disposed in or processed through a PVD chamber are provided herein. In some embodiments, such a method includes: sputtering source material from a target assembly onto a first substrate while the source material is at a first erosion state and while providing a first amount of RF power to the target assembly to deposit a dielectric oxide layer onto a first substrate having a desired resistance-area; and subsequently sputtering source material from the target assembly onto a second substrate while the source material is at a second erosion state and while providing a second amount of RF power to the target assembly, wherein the second amount of RF power is lower than the first amount of RF power by a predetermined amount calculated to maintain the desired resistance-area.

20 Claims, 3 Drawing Sheets

(58) Field of Classification Search
CPC .. C23C 16/403; C23C 14/081; H01J 37/3447; H01J 37/3473; H01J 37/3476; H01J 37/3482
See application file for complete search history.

(56) References Cited

U.S. PATENT DOCUMENTS

| | | | |
|---|---|---|---|
| 2005/0184669 A1* | 8/2005 | Chistyakov | C23C 14/35 315/111.21 |
| 2007/0297099 A1* | 12/2007 | Hirata | B82Y 10/00 360/324.2 |
| 2008/0062557 A1* | 3/2008 | Tsuchiya | G11B 5/59683 360/86 |
| 2009/0186770 A1* | 7/2009 | Shi | G01R 33/1269 506/6 |
| 2011/0031109 A1* | 2/2011 | Lee | H01J 37/3429 204/192.12 |
| 2012/0028461 A1 | 2/2012 | Ritchie et al. | |
| 2013/0134032 A1* | 5/2013 | Tsunekawa | B82Y 40/00 204/192.2 |
| 2013/0199925 A1 | 8/2013 | Yong et al. | |
| 2013/0260057 A1 | 10/2013 | Wu et al. | |
| 2015/0252467 A1* | 9/2015 | Allen | C23C 14/0641 204/192.12 |
| 2015/0315704 A1* | 11/2015 | Nakano | C23C 16/402 427/569 |
| 2015/0371847 A1* | 12/2015 | Cheng | C23C 14/54 204/192.25 |
| 2016/0005958 A1* | 1/2016 | Seino | H01L 43/12 438/3 |
| 2016/0056024 A1* | 2/2016 | Johanson | H01J 37/32733 204/192.12 |
| 2016/0133831 A1* | 5/2016 | Kim | C23C 14/083 204/192.24 |
| 2016/0222503 A1* | 8/2016 | Chowdhury | H01J 37/3464 |
| 2016/0244874 A1 | 8/2016 | Ge et al. | |
| 2019/0115527 A1* | 4/2019 | Park | H01L 43/12 |

OTHER PUBLICATIONS

Dmytro Apalkov, Bernard Dieny, J. Slaughter. Magnetoresistive Random Access Memory. Proceedings of the IEEE, Institute of Electrical and Electronics Engineers, 2016, 104, pp. 1796-1830. ff10.1109/JPROC.2016.2590142ff. ffhal-01834195f (Year: 2016).*
Du-Yeong Lee, Effects of the radio-frequency sputtering power of an MgO tunneling barrier on the tunneling magneto-resistance ratio for Co2Fe6B2/MgO-based perpendicular-magnetic tunnel junctions. J. Mater. Chem. C, Apr. 2016, 135 (Year: 2016).*
International Search Report for PCT/US2019/023146, dated Jul. 4, 2019.
Supplementary European Search Report for EP 19771029, dated Oct. 27, 2021.
Chaoumead Accarat et al, "The Effects of RF Sputtering Power and Gas Pressure on Structural and Electrical Properties of ITiO Thin Film", Advances in Condensed Matter Physics, vol. 2012, Jan. 1, 2012 (Jan. 1, 2012), pp. 1-7, XP055855423, US.
Raj Amet at al., "Fabrication techniques and material properties of dielectric MgO thin filmsA status review", CIRP Journal of Manufacturing Science and Technology, Elsevier, vol. 2, No. 2, Jan. 1, 2010, pp. 92-113, XP027009362, Amsterdam, NL.

* cited by examiner

100

```
┌─────────────────────────────────────────────────────┐
│ SPUTTERING SOURCE MATERIAL FROM A TARGET ASSEMBLY   │
│ ONTO A FIRST SUBSTRATE WHILE THE SOURCE MATERIAL IS │
│ AT A FIRST EROSION STATE AND WHILE PROVIDING A FIRST│ ～110
│ AMOUNT OF RF POWER TO THE TARGET ASSEMBLY TO        │
│ DEPOSIT A DIELECTRIC OXIDE LAYER ONTO A FIRST       │
│ SUBSTRATE HAVING A DESIRED RESISTANCE-AREA          │
└─────────────────────────────────────────────────────┘
                          ↓
┌─────────────────────────────────────────────────────┐
│ SUBSEQUENTLY SPUTTERING SOURCE MATERIAL FROM THE    │
│ TARGET ASSEMBLY ONTO A SECOND SUBSTRATE WHILE       │
│ THE SOURCE MATERIAL IS AT A SECOND EROSION STATE    │
│ AND WHILE PROVIDING A SECOND AMOUNT OF RF POWER     │
│ TO THE TARGET ASSEMBLY, WHEREIN THE SECOND          │ ～120
│ AMOUNT OF RF POWER IS LOWER THAN THE FIRST AMOUNT   │
│ OF RF POWER BY A PREDETERMINED AMOUNT CALCULATED    │
│ TO MAINTAIN THE DESIRED RESISTANCE-AREA             │
└─────────────────────────────────────────────────────┘
```

```
┌─────────────────────────────────────────────────────┐
│ SPUTTERING MAGNESIUM OXIDE SOURCE MATERIAL FROM A   │
│ TARGET ASSEMBLY ONTO A FIRST SUBSTRATE WHILE THE    │
│ MAGNESIUM OXIDE SOURCE MATERIAL IS AT A FIRST EROSION│
│ STATE AND WHILE PROVIDING A FIRST AMOUNT OF RF POWER│ ～210
│ TO THE TARGET ASSEMBLY TO DEPOSIT A MAGNESIUM OXIDE │
│ LAYER ONTO THE FIRST SUBSTRATE HAVING A DESIRED     │
│ RESISTANCE-AREA                                     │
└─────────────────────────────────────────────────────┘
                          ↓
┌─────────────────────────────────────────────────────┐
│ SUBSEQUENTLY SPUTTERING MAGNESIUM OXIDE SOURCE      │
│ MATERIAL FROM THE TARGET ASSEMBLY ONTO A SECOND     │
│ SUBSTRATE WHILE THE MAGNESIUM OXIDE SOURCE          │
│ MATERIAL IS AT A SECOND EROSION STATE AND WHILE     │
│ PROVIDING A SECOND AMOUNT OF RF POWER TO THE        │ ～220
│ TARGET ASSEMBLY, WHEREIN THE SECOND AMOUNT OF RF    │
│ POWER IS LOWER THAN THE FIRST AMOUNT OF RF POWER BY │
│ A PREDETERMINED AMOUNT CALCULATED TO MAINTAIN A     │
│ DESIRED RESISTANCE-AREA                             │
└─────────────────────────────────────────────────────┘
```

┌──────────────────────────────────────────────┐
│ SPUTTERING SOURCE MATERIAL FROM A TARGET ASSEMBLY │
│ ONTO A FIRST SUBSTRATE FOR A FIRST DEPOSIT DURATION │
│ WHILE THE SOURCE MATERIAL IS AT A FIRST EROSION STATE │
│ AND WHILE PROVIDING A FIRST AMOUNT OF RF POWER TO │ — 410
│ THE TARGET ASSEMBLY TO DEPOSIT A FIRST DIELECTRIC │
│ OXIDE LAYER ONTO A FIRST SUBSTRATE HAVING A DESIRED │
│ RESISTANCE-AREA │
└──────────────────────────────────────────────┘
                        ↓
┌──────────────────────────────────────────────┐
│ SUBSEQUENTLY SPUTTERING SOURCE MATERIAL FROM THE │
│ TARGET ASSEMBLY TO DEPOSIT A SECOND DIELECTRIC OXIDE │
│ LAYER HAVING THE DESIRED RESISTANCE-AREA ONTO A │
│ SECOND SUBSTRATE FOR A SECOND DEPOSIT DURATION │
│ WHILE THE SOURCE MATERIAL IS AT A SECOND EROSION │
│ STATE AND WHILE PROVIDING THE FIRST AMOUNT OF RF │ — 420
│ POWER TO THE TARGET ASSEMBLY, WHEREIN THE SECOND │
│ DEPOSIT DURATION IS LOWER THAN THE FIRST DEPOSIT │
│ DURATION BY A PREDETERMINED AMOUNT CALCULATED TO │
│ MAINTAIN THE DESIRED RESISTANCE-AREA │
└──────────────────────────────────────────────┘

RESISTANCE-AREA (RA) CONTROL IN LAYERS DEPOSITED IN PHYSICAL VAPOR DEPOSITION CHAMBER

CROSS-REFERENCE

This application claims benefit of U.S. provisional patent application Ser. No. 62/646,186, filed Mar. 21, 2018 which is herein incorporated by reference in its entirety.

FIELD

Embodiments of the present disclosure generally relate to methods of processing semiconductor devices.

BACKGROUND

Sputtering, alternatively called physical vapor deposition (PVD), is used in depositing metals and related materials such as metal oxides in the fabrication of semiconductor integrated circuits. Typical PVD processes sputter material from a target using a plasma formed by supplying RF power to the target in conjunction with magnetic confinement at the target surface. However, a drawback observed by the inventors of using RF power supplied to the target is that the consistency of the resistance-area ("RA") in one or more deposited layers or film stacks is diminished as the target material erodes. The inventors believe that inconsistent RA is detrimental to the stability and robust manufacturing of semiconductor devices such as MRAM device(s) and film stacks. The inventors have also observed that the thickness of the deposited layer, such as MGO, may be a root cause of RA trend-up and inconsistency over the lifespan of a target. The RA changes throughout the life of the target and as the thickness of the deposited layer increases.

RA inconsistency, which can be seen directly by an increase, decrease of shift or the RA measured when comparing multiple semiconductor devices processed through a PVD chamber, remains problematic in semiconductor device manufacturing including MRAM devices. The inventors have observed that RA inconsistency, results in batch inconsistency and tends to show as a function of target life.

Thus, the inventors have provided embodiments of methods that can advantageously be used to deposit materials while improving RA uniformity throughout the life of a target and robust batch manufacturing.

SUMMARY

Methods of depositing a metal-containing layer atop a substrate disposed in a physical vapor deposition process (PVD) chamber are provided herein. In some embodiments, a method of depositing a dielectric oxide layer atop one or more substrates in one or more film stacks in a physical vapor deposition (PVD) chamber, includes: sputtering source material from a target assembly onto a first substrate while the source material is at a first erosion state and while providing a first amount of RF power to the target assembly to deposit a dielectric oxide layer onto a first substrate having a desired resistance-area; and subsequently sputtering source material from the target assembly onto a second substrate while the source material is at a second erosion state and while providing a second amount of RF power to the target assembly, wherein the second amount of RF power is lower than the first amount of RF power by a predetermined amount calculated to maintain the desired resistance-area.

In another embodiment, a method of depositing a magnesium oxide layer atop one or more substrates in a physical vapor deposition (PVD) chamber, includes: sputtering magnesium oxide source material from a target assembly onto a first substrate while the magnesium oxide source material is at a first erosion state and while providing a first amount of RF power to the target assembly to deposit a magnesium oxide layer onto the first substrate having a desired resistance-area; and subsequently sputtering magnesium oxide source material from the target assembly onto a second substrate while the magnesium oxide source material is at a second erosion state and while providing a second amount of RF power to the target assembly, wherein the second amount of RF power is lower than the first amount of RF power by a predetermined amount calculated to maintain a desired resistance-area.

In another embodiment, a non-transitory computer readable medium having instructions stored thereon that, when executed, cause a method of depositing a dielectric oxide layer atop one or more substrates in one or more film stacks in a physical vapor deposition (PVD) chamber, including: sputtering source material from a target assembly onto a first substrate while the source material is at a first erosion state and while providing a first amount of RF power to the target assembly to deposit a dielectric oxide layer onto a first substrate having a desired resistance-area; and subsequently sputtering source material from the target assembly onto a second substrate while the source material is at a second erosion state and while providing a second amount of RF power to the target assembly, wherein the second amount of RF power is lower than the first amount of RF power by a predetermined amount calculated to maintain the desired resistance-area.

In another embodiment, a method of depositing a dielectric oxide layer atop one or more substrates in a physical vapor deposition (PVD) chamber, includes: sputtering source material from a target assembly onto a first substrate for a first deposit duration while the source material is at a first erosion state and while providing a first amount of RF power to the target assembly to deposit a first dielectric oxide layer onto a first substrate having a desired resistance-area; and subsequently sputtering source material from the target assembly to deposit a second dielectric oxide layer having the desired resistance-area onto a second substrate for a second deposit duration while the source material is at a second erosion state and while providing the first amount of RF power to the target assembly, wherein the second deposit duration is lower than the first deposit duration by a predetermined amount calculated to maintain the desired resistance-area.

In some embodiments, a method of depositing a dielectric oxide layer atop one or more substrates in one or more film stacks in a physical vapor deposition (PVD) chamber, includes: sputtering source material from a target assembly onto a first substrate while the source material is at a first erosion state and while providing a first amount of RF power to the target assembly to deposit a dielectric oxide layer onto a first substrate having a desired resistance-area; and subsequently sputtering source material from the target assembly onto a second substrate while the source material is at a second erosion state and while providing a second amount of RF power to the target assembly, wherein the second amount of RF power is lower than the first amount of RF power by a predetermined amount sufficient to maintain the desired resistance-area.

Other and further embodiments of the present invention are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The present disclosure relates to methods of depositing a dielectric oxide layer atop one or more substrates in one or more film stacks in a physical vapor deposition (PVD) chamber. The methods described herein advantageously facilitate the deposition of one or more dielectric oxide layers suitable for use in a semiconductor device such as such as MRAM device(s) including, for example a magnesium oxide layer, having advantageous resistance area consistency and robust manufacturing thereof. The methods described herein also advantageously compensate power or deposition time in forming a semiconductor device such as an MRAM film stack including a magnetic tunnel junction (MTJ) with materials such as thin magnesium oxide films or thin magnetic layer films in order to promote uniform RA in a plurality of substrates in one or more film stacks over the life of the PVD chamber target material.

Figure 1:
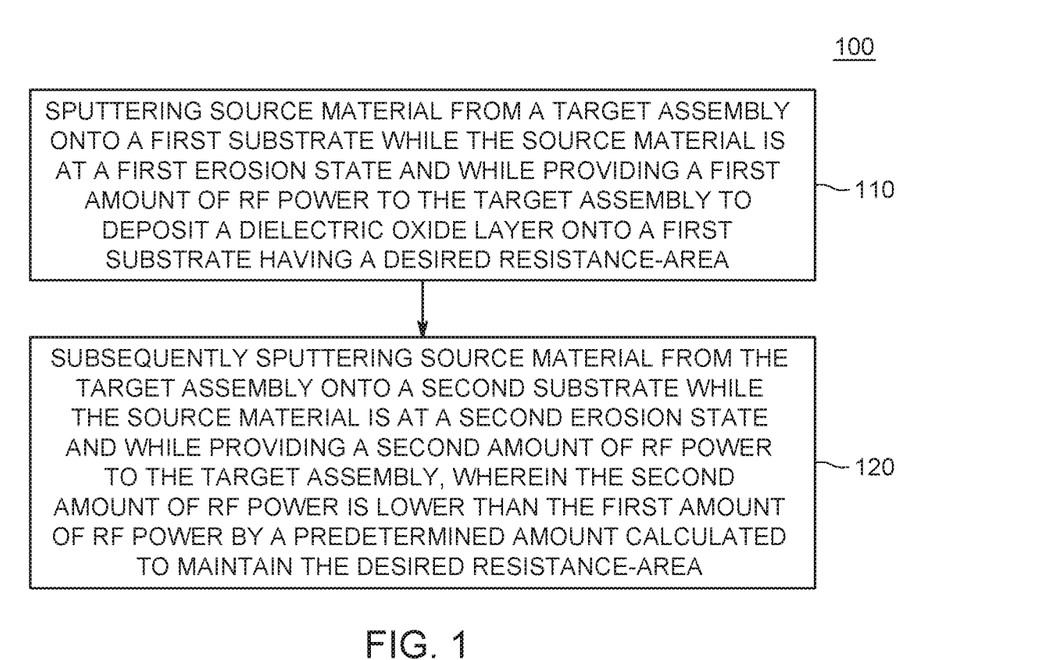
FIG. 1 is a flowchart illustrating a method of depositing a dielectric oxide layer atop one or more substrates in one or more film stacks in a physical vapor deposition (PVD) chamber in accordance with some embodiments of the present disclosure.
Figure 3:
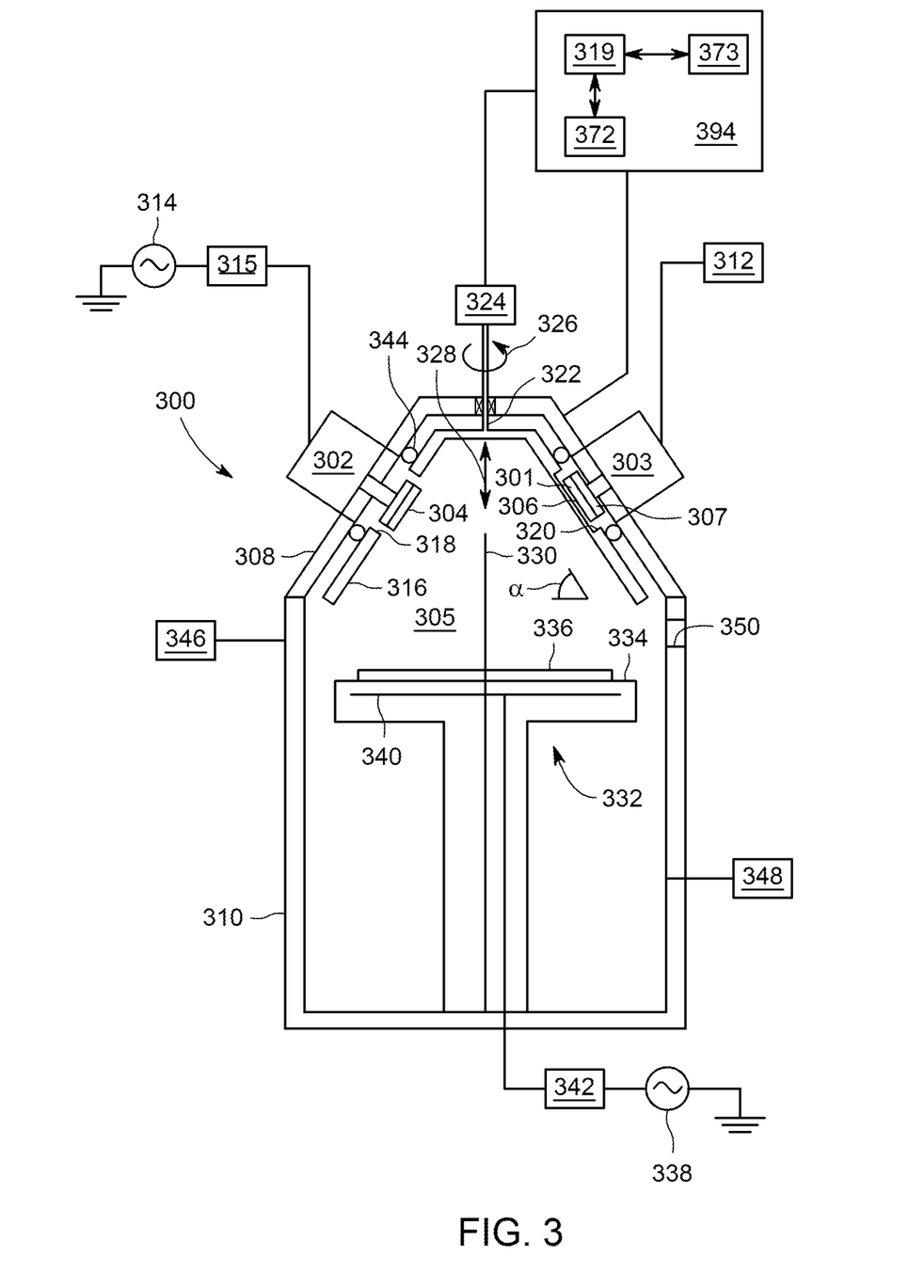
FIG. 3 depicts a schematic cross sectional view of a process chamber in accordance with some embodiments of the present disclosure.

FIG. 1 depicts a flow chart of a method 100 for depositing a layer atop a substrate disposed in a physical vapor deposition process system of the type described in FIG. 3. FIG. 3 depicts a simplified, cross-sectional view of a physical vapor deposition (PVD) processing system such as process chamber 300, in accordance with some embodiments of the present disclosure. Examples of other PVD chambers suitable for performing the method 100 described herein include the CIRRUS™ and AVENIR™ PVD processing chambers, both commercially available from Applied Materials, Inc., of Santa Clara, Calif. In embodiments, the PVD chamber may include a magnetron.

Figure 5:
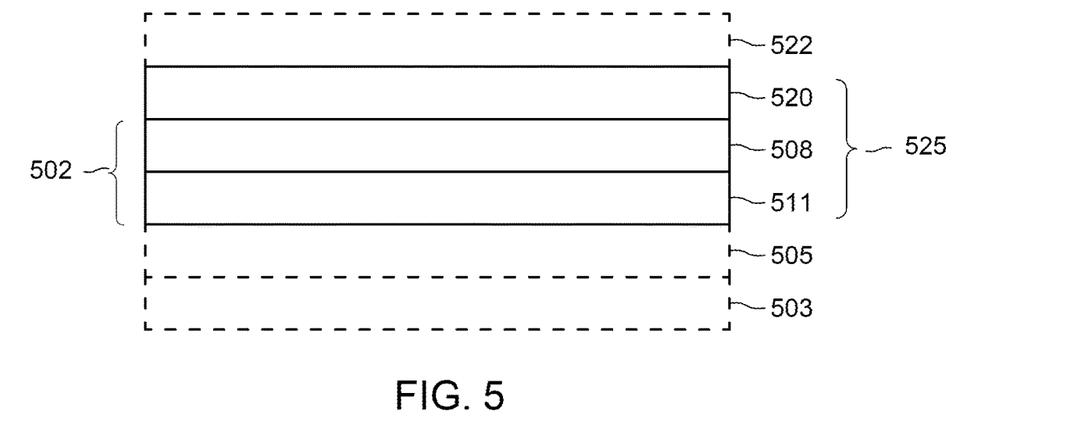
FIG. 5 is a film stack including a magnesium oxide layer atop one or more substrates in accordance with the present disclosure.

The method 100 begins by providing a substrate 336 to a PVD process chamber, for example the process chamber 300 shown in FIG. 3. The process chamber 300 depicted in FIG. 3 includes a substrate support 332, a target assembly 306 and source material 301 from target assembly 306 which is disposed on a support 307. As described below with respect to FIG. 3, the process chamber 300 further comprises an RF power source 314 to provide RF energy to the target assembly 306 including source material 301. Although RF power source is shown connected to cathode 302, the RF power source may be connected to a plurality of cathodes such as cathode 302, and cathode 303 (for powering target assembly 306). In embodiments, at least a first target assembly such as target assembly 304 and a second target assembly such as target assembly 306 may be provided. The target assemblies may be configured as is known in the art and may include one or more dielectric targets, metal targets, or MGO targets as described herein. In embodiments, the sequence of method 100 includes processes that are performed upon a magneto-resistive random access memory (MRAM) film stack during fabrication of such MRAM device. For example, FIG. 5 shows an MRAM film stack such as film stack 502 including a tunnel layer 508 including a magnetic tunnel junction (MTJ) of an MRAM device composed of a non-magnetic dielectric material, such as magnesium oxide (MGO). The MRAM film stack such as film stack 502 may include three layers, or a plurality of film layers known in the art for forming MRAM film stacks for use in semiconductor devices.

In embodiments, the substrate 336 may be any suitable substrate having any suitable geometry, such as a round wafer, square, rectangular, or the like. The substrate 336 may comprise any suitable materials, such as one or more of silicon (Si), silicon oxide ($SiO_2$), silicon nitride (SiN), glass, other dielectric materials, or the like, and may have one or more layers of other materials disposed atop the substrate 336. In some embodiments, the substrate 336 may include an upper layer of a low k dielectric material, and in some embodiments, an ultra-low k dielectric material. As used herein ultra-low k dielectric materials include dielectric materials having a k value of less than or equal to about 2.5. The substrate 336 may be a blank substrate (e.g., having no features disposed on the substrate), or the substrate 336 may have features formed in or on the substrate, such as vias or trenches, or high aspect ratio features, for example, for through silicon via (TSV) applications or the like. A high aspect ratio feature as used herein may include those features having a height to width aspect ratio of at least about 5:1 (e.g., a high aspect ratio).

In embodiments, the substrate 336 includes a plurality of films suitable for forming an MRAM device or a magnetic tunnel junction (MTJ) of an MRAM device. In some embodiments, the substrate may include a multi-layer magnetic stack. In some embodiments, the substrate may comprise a memory cell in a MRAM device or a multi-layered structure typically including two sets of magnetic layers separated by a non-magnetic dielectric material. In embodiments, one or more layers are deposited as overlying blanket films to form substrate 336, and then patterned to form the MRAM device. In some embodiments, an MRAM device may include a top electrode layer, a free magnetic layer, a tunnel layer, a magnetic stack such as synthetic antiferromagnets or a multilayered magnetic stack, a bottom electrode, and optionally a barrier layer. In embodiments, substrate 336 includes one or more substrates as described herein suitable for including a magnesium oxide layer atop the one or more substrates. In embodiments, substrate 336 includes one or more substrates in one or more film stacks suitable for a magnesium oxide layer deposits thereon. In embodiments, substrate 336 includes a non-magnetic dielectric material, such as magnesium oxide (MGO) deposited in accordance with the present disclosure.

At 102, source material 301 is sputtered from a target assembly 306 while the source material 301 is at a first erosion state and while providing a first amount of RF power to the target assembly 306 to form a plasma within a processing region 305 of the process chamber 300 and to deposit, for example a dielectric oxide layer onto the substrate 336. In embodiments, source material 301 is sputtered from a target assembly 306 onto a substrate 336 such as a first substrate while the source material 301 is at a first erosion state while providing a first amount of RF power to the target assembly 306 to deposit a dielectric oxide layer onto a first substrate having a desired resistance-area. In embodiments, the dielectric oxide layer comprises or consists of MGO deposited to a thickness of 5 to 20 angstroms, or 5 to 10 angstroms. In embodiments, a plasma forming gas is provided to a processing region 305 of the process chamber 300. The plasma-forming gas may include one or more inert gases, such as a noble gas, or other inert gases. For example, non-limiting examples of suitable plasma forming gases include one or more of argon (Ar), helium (He), xenon (Xe), neon (Ne), hydrogen ($H_2$), nitrogen ($N_2$), oxygen ($O_2$), or the like.

In some embodiments, a first amount of RF power is provided to the target assembly 306 to ignite the plasma-forming gas into a plasma within the processing region 305 of the process chamber 300. The first amount of RF power is an amount of RF power suitable to form a plasma within the processing region 305 and may vary depending upon chamber size, geometry, or the like. For example, in some embodiments, the first amount of RF power is about 500 to about 20000 watts, about 1000 to about 10,000 watts, or about 1500 to about 8000 watts.

In embodiments, the source material 301 is sputtered from the target assembly 306 to deposit the metal-containing layer onto the substrate 336. The source material 301 is initially at a first erosion state. In some embodiments, source material 301 at the first erosion state is substantially uneroded (i.e. is at or very near the beginning of the target life). In one embodiment, a substantially uneroded source material comprises or consists of a source that is at least 99.9% present. In some embodiments the source material is a material suitable for depositing a dielectric oxide layer atop one or more substrates in one or more film stacks in a physical vapor deposition (PVD) chamber. In some embodiments, the source material comprises or consists of magnesium oxide. In some embodiments the source material 301 may comprise one or more of metals, metal alloys, or the like, suitable for forming a metal-containing layer on the substrate 336. For example, the source material 301 may comprise one or more of magnesium, magnesium oxide, titanium (Ti), tantalum (Ta), cobalt (Co), tungsten (W), aluminum (Al), or the like. In embodiments, source material 301 may comprise one of magnesium, magnesium oxide, titanium (Ti), tantalum (Ta), cobalt (Co), tungsten (W), or aluminum (Al). Metal atoms from the source material 301 are sputtered using the plasma while maintaining a first pressure in the PVD chamber. The first pressure is a pressure sufficient to ionize a predominant portion of metal atoms being sputtered from the target. The first pressure may be dependent on process chamber geometry (such as substrate size, target to substrate distance, and the like).

When depositing a dielectric oxide layer atop one or more substrates in one or more film stacks in a physical vapor deposition (PVD) chamber layer, such as a magnesium oxide layer, the inventors have observed that decreasing the RF power over the life of the target assembly 306 allows for consistent RA of the deposited layer upon substrate 336, that is advantageous for forming one or more, such as a plurality of semiconductor devices with a substantially uniform RA through the batch. In addition, decreasing the RF power delivered to the target assembly as a function of target lifespan further advantageously facilitates robust semiconductor device fabrication. In embodiments, a desired resistance-area of a film stack including a magnesium oxide layer in accordance with the present disclosure is between 2 and 20 ohm[$um^2$]. In embodiments, a magnesium oxide layer is a dielectric layer. In some embodiments, where consistent RA is achieved by power compensation as described herein, the deposit time may be fixed such that a uniform deposit duration is repeated at intervals throughout the target life, such as an MGO target life of e.g., 100 kWhr. For example in embodiments, the duration of deposition may be fixed at 45 seconds, 49 seconds, 50 seconds, or 60 seconds or at a single fixed duration between about 30 to 60 seconds.

Thus, at 104, sputtering source material 301, subsequent to 102 described above, is performed from the target assembly 306 while the source material 301 is at a second erosion state and while providing a second amount of RF power to the target assembly 306, wherein the second amount of RF power is lower than the first amount of RF power by a predetermined amount calculated or sufficient to maintain a desired resistance-area. In embodiments, sputtering source material 301 from the target assembly 306 onto a second substrate while the source material is at a second erosion state and while providing a second amount of RF power to the target assembly, wherein the second amount of RF power is lower than the first amount of RF power by a predetermined amount calculated or sufficient to maintain the desired resistance-area. In embodiments, the second substrate is identical to substrate 336, and may include one or more layers are described above with respect to substrate 336. In embodiments, the second erosion state is different than the first erosion state, for example and may include e.g., an eroded condition formed after 20 kWhrs of use, 40 kWhrs of use, 60 kWhrs of use or between 20 to 100 kWhrs of use. In some embodiments, while sputtering the source material 301, the amount of RF power provided to the target assembly is decreased by a predetermined amount calculated or sufficient to maintain a desired resistance-area of the film stack including an MGO layer as the source material 301 erodes. For example, the predetermined amount may be determined by determining the amount of RF power (i.e., a second RF amount) suitable for maintaining a predetermined RA when the source material 301 is at a second erosion state (e.g., more eroded than the first erosion state). Alternatively, for example, the predetermined amount may be determined by determining the amount of RF power (i.e., a second RF amount) suitable for maintaining the RA when at the second erosion state to be within a predetermined tolerance or range of RA (e.g., when the source material 301 is at the first erosion state).

In embodiments, the second amount of RF power is about 75 to 300 W lower than the first amount of RF power, or about 1 to 100 W lower than the first amount of RF power, or about 1 to 200 W lower than the first amount of RF power.

In embodiments, the desired RA may vary depending upon the application. Various substrates including various layers may have a different desired or predetermined RA for example, throughout the fabrication of a plurality of substrates or film stacks in accordance with the present disclosure. In some embodiments, the RA may be held constant, substantially constant, or within a predetermined range as the target erodes from the first erosion state to the second erosion state. For example, in some embodiments, the RA can be controlled to be within about +/−5%, 4%, 3%, 2% or 1% over the life of the target (e.g., in a non-limiting example where the resistivity of the deposited material is controlled to within an about +/−5%, 4%, 3%, 2% or 1% range). In some embodiments, the RA can be controlled to be within about +/−2% over the life of the target (e.g., in a non-limiting example where the RA of the deposited material is controlled to within an about +/−2% range). In some embodiments, the RA can be controlled to be within about +/−2% over the life of the target (e.g., in a non-limiting example where the deposited material is MGO and controlled to within an about +/−2% range). In some embodiments, the RA can be controlled to be within about +/−1.5% over the life of the target.

The determination of the second amount of RF power may be determined empirically or by modeling. For example, given a particular desired substrate, one of skill in the art may measure the RA of a substrate at various times throughout the life of a target assembly and source material thereof. For example, using a fixed deposition duration, and known power, one of skill in the art can measure RA at different kWh over the life of the target (which may be 100 kWhr) at different power levels. Upon measuring a particular substrate at various times over the life of the target at different power levels, RA measurements may be obtained for a linear or substantially linear amount of power over 100 kWhr. One of skill in the art may determine a polynomial equation for a particular substrate to calculate the amount of power compensation, or predetermined amount to reduction of first amount of RF power sufficient to maintain the desired resistance-area. Accordingly, a plurality of substrates, such as a first and second substrate may be processed through a PVD chamber as described herein and maintain a consistent RA as the target erodes over time. In embodiments, the plurality of substrates are substantially similar such as a batch of substrates or semiconductor devices such as an MRAM device.

In other embodiments described further below, deposition time is not fixed and may be adjusted to compensate for RA in one or more substrates or film stacks made in accordance with the present disclosure. The determination of a second deposit duration may be determined empirically or by modeling. Upon measuring a particular substrate at various times over the life of the target at different adjusted times, RA measurements may be obtained for a linear or substantially linear deposit time (seconds) over the life of a target or 100 kWhr. One of skill in the art may determine a polynomial equation for a particular substrate to calculate the amount of time compensation, or predetermined amount to reduce the first deposit duration sufficient to maintain the desired resistance-area. Accordingly, a plurality of substrates, such as a first and second substrate may be processed through a PVD chamber as described herein and maintain a consistent RA as the target erodes over time. In embodiments, the plurality of substrates are substantially similar such as a batch of substrates or semiconductor devices such as an MRAM device.

Referring back to the process sequence of FIG. 1, relating to power compensation as described herein, in some embodiments, the source material 301 at the second erosion state is substantially eroded (i.e. is at or very near the end of the target life). In some embodiments, the RF power applied to the target assembly 306 is decreased at a linear rate from the first amount at the first erosion state to the second amount at the second erosion state.

Optionally, a secondary energy source 312 coupled to the target assembly 306 may provide RF power as described above, or in embodiments, DC power to the target assembly 306 to direct the plasma towards the target assembly 306. In some embodiments, the DC power may range from about 1 to about 20 kilowatts (kW), although the amount of DC power applied may vary depending upon chamber geometry (e.g., target size or the like). In some embodiments, the DC power may also be adjusted over the life of the target in the same manner as described above for the RF power. The DC power may be adjusted to control the deposition rate of sputtered metal atoms on the substrate. For example, increasing the DC power can result in increased interaction of the plasma with the target and increased sputtering of metal atoms from the target. In some embodiments, the DC power may be adjusted to maintain a ratio of DC power to RF power of about 2:1 to about 10:1.

In some embodiments, a PVD chamber such as, for example, a multi-cathode PVD chamber (e.g., process chamber 300) includes a plurality of cathodes such as cathode 302, cathode 303 having a corresponding plurality of targets as described above, or in some embodiments, for example, five cathodes attached to the chamber body (for example, via a chamber body adapter 308). The processing chamber includes a substrate support 332 having a support surface 334 to support a substrate 336. The process chamber 300 includes an opening 350 (e.g., a slit valve) through which an end effector (not shown) may extend to place a substrate 336 onto lift pins (not shown) for lowering the substrate onto a support surface 334.

In the embodiment shown in FIG. 3, each target is disposed at a predetermined angle $\alpha$ with respect to the support surface 334. In some embodiments, the angle $\alpha$ may be between about 10° to about 50°. The substrate support includes an RF bias power source 338 coupled to a bias electrode 340 disposed in the substrate support 332 via a matching network 342. The chamber body adapter 308 is coupled to an upper portion of a chamber body 310 of the process chamber 300 and is grounded. In some embodiments, each cathode can have a DC power source such as a secondary energy source 312 or an RF power source 314 and an associated magnetron. In embodiments, a dual power source configuration permits both DC powered processes and RF powered processes to occur in the same process chamber such as process chamber 300. In the case of the RF power source 314, the RF power source 314 is coupled to the cathode 302, or optionally, cathode 303, via an RF matching network 315. The RF energy supplied by the RF power source 314 may range in frequency from about 13.56 MHz and to about 162 MHz or above. For example, non-limiting frequencies such as 13.56 MHz, 27.12 MHz, 60 MHz, or 162 MHz can be used.

The RF bias power source 338 may be coupled to the substrate support 332 in order to induce a negative DC bias on the substrate 336. In addition, in some embodiments, a negative DC self-bias may form on the substrate 336 during processing. For example, RF energy supplied by the RF bias power source 338 may range in frequency from about 2 MHz to about 60 MHz, for example, non-limiting frequencies such as 2 MHz, 13.56 MHz, or 60 MHz can be used. In other applications, the substrate support 332 may be grounded or left electrically floating.

A shield 316 is rotatably coupled to the chamber body adapter 308 and is shared by all the cathodes. Depending on the number of targets that need to be sputtered at the same time, the rotating shield 316 can have one or more holes to expose a corresponding one or more targets. The shield 316 limits or eliminates cross-contamination between the plurality of targets such as target assembly 304,306. For example, in some embodiments where five cathodes are provided, the shield 316 may include at least one hole such as hole 318 to expose a target assembly 304 to be sputtered and at least one pocket 320 to house a target (e.g., metallic target or MGO target such as target assembly 306) that is not being sputtered. The shield 316 is rotationally coupled to the chamber body adapter 308 via a shaft 322. In some embodiments, the shield 316 has one or more sidewalls configured to surround a processing volume within the inner or interior volume such as processing region 305.

An actuator 324 is coupled to the shaft 322 opposite the shield 316. An actuator 324 is configured to rotate the shield 316, as indicated by arrow 326, and move the shield 316 up and down along a central axis 330 of the process chamber 300, as indicated by arrow 328. When the shield 316 is moved up into a retracted position so that a face of the shield surrounding the hole 318 is behind a face of the target (e.g., dielectric target or target assembly 304) facing the substrate 336, materials sputtered in a dark space surrounding the target (e.g., on a sidewall of the hole 318) are minimized. As a result, materials sputtered from one target (e.g. dielectric target such as target assembly 304) do not contaminate another target (e.g., metallic target or MGO target e.g. target assembly 306) due to sputtering of material that has accumulated in the dark space.

The process chamber 300 also uses the shield 316 to surround the interior volume such as processing region 305 of the process chamber 300 and to protect other chamber components besides the targets such as target assembly 304, 306 from damage and/or contamination from processing. During processing, source material from a target assembly 304, 306 is sputtered onto the substrate 336. The sputtering process forms a thin deposition layer or film of the source material on the surface of the substrate 336. The sputtering process, however, not only deposits source material on the substrate 336, but also on the shield 316 and other surfaces of the interior volume such as processing region 305. The extra deposits are unwanted coatings or depositions on surfaces other than the substrate 336 and may generate particles that can break away from the interior surfaces and fall onto the substrate 336. These particles may cause defects in the deposition layer or film on the surface of the substrate 336. Particle generation is a significant and long standing problem for substrate processing.

The process chamber 300 may include a plurality of RF grounding rings 344 to provide improved grounding of the shield 316 to the grounded chamber body adapter 308 when the shield is in the retracted position. The RF grounding rings 344 advantageously prevent the shield 316 from getting negatively charged by minimizing the energy between the plasma and the shield.

The process chamber 300 may further include a process gas supply 346 to supply a predetermined process gas to an interior volume such as processing region 305 of the process chamber 300. For example, the process gas supply 346 may supply oxygen to the interior volume such as processing region 305 after the metallic target such as target assembly 306 has been sputtered as discussed in more detail below. The process chamber 300 may also include an exhaust pump 348 fluidly coupled to the interior volume such as processing region 305 to exhaust the process gas and to facilitate in maintaining a desired pressure inside the process chamber 300. Pressure level adjustment is used in some embodiments of the present principles and is discussed in more detail below.

The process chamber 300 can be used in the processing of many new memory products such as, for example, spin-transfer torque magnetic random access memory (STT-MRAM). STT-MRAM have a layered deposition stack that is dependent on a critical tunneling barrier layer. A typical dielectric material used for the barrier layer is magnesium oxide (MgO). The MgO barrier layer can be deposited, for example, using RF power on MgO (an MgO sputtering target is used for wafer deposition). However, DC power does not operate efficiently with dielectric films due to the buildup of dielectric material on the interior surfaces of the process chamber. AC powered processes, such as RF powered processes, work better with dielectric materials.

A controller 394 may be provided and coupled to various components of the PVD processing system such as process chamber 300 to control the operation of the system. The controller 394 includes a central processing unit (CPU) 319, a memory 372, and support circuits 373. The controller 394 may control the PVD processing system such as process chamber 300 directly, or via computers (or controllers) associated with particular process chamber and/or support system components. The controller 394 may be one of any form of general-purpose computer processor that can be used in an industrial setting for controlling various chambers and sub-processors. The memory, or computer readable medium, 372 of the controller 394 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 373 are coupled to the CPU 319 for supporting the processor in a conventional manner. These circuits include cache, power supplies, clock circuits, input/output circuitry and subsystems, and the like. Inventive methods as described herein may be stored in the memory 372 as software routine that may be executed or invoked to control the operation of the PVD processing system such as process chamber 300 in the manner described herein. The software routine may also be stored and/or executed by a second CPU (not shown) that is remotely located from the hardware being controlled by the CPU 319.

Still referring to FIG. 1, and process sequence of method 100, in some embodiments, the present disclosure relates to a method of depositing a dielectric oxide layer atop one or more substrates in one or more film stacks in a physical vapor deposition (PVD) chamber. At process sequence 110, the process includes sputtering source material from a target assembly onto a first substrate while the source material is at a first erosion state and while providing a first amount of RF power to the target assembly to deposit a dielectric oxide layer onto a first substrate having a desired resistance-area. The process sequence includes at 120 subsequently sputtering source material from the target assembly onto a second substrate while the source material is at a second erosion state and while providing a second amount of RF power to the target assembly, wherein the second amount of RF power is lower than the first amount of RF power by a predetermined amount calculated or sufficient to maintain the desired resistance-area. In embodiments, the method 100 includes calculating a predetermined amount of power reduction or RF power reduction to maintain a desired resistance-area of the one or more film stacks over a lifespan of the target assembly. In embodiments, the source material at the second erosion state is partially or substantially eroded. In embodiments, the source material at the first erosion state is substantially uneroded. In embodiments, the first amount of RF power provided to the target assembly at the first erosion state is decreased at a linear rate to the second amount of RF power provided to the target assembly at the second erosion state. In embodiments, the source material is one of magnesium, magnesium oxide, titanium (Ti), tantalum (Ta), cobalt (Co), tungsten (W), or aluminum (Al). In embodiments, the source material comprises or consists of magnesium oxide. In some embodiments, a process sequence includes providing a plasma forming gas comprising one or more of argon (Ar), helium (He), xenon (Xe), neon (Ne), hydrogen ($H_2$), nitrogen ($N_2$), or oxygen ($O_2$) while sputtering source material. In embodiments, the first amount of RF power is about 500 W to about 20000 W. In some embodiments, second amount of RF power is about 1 to 100 W lower than the first amount of RF power. In some embodiments, second amount of RF power is about 1 to 200 W lower than the first amount of RF power.

Figure 2:
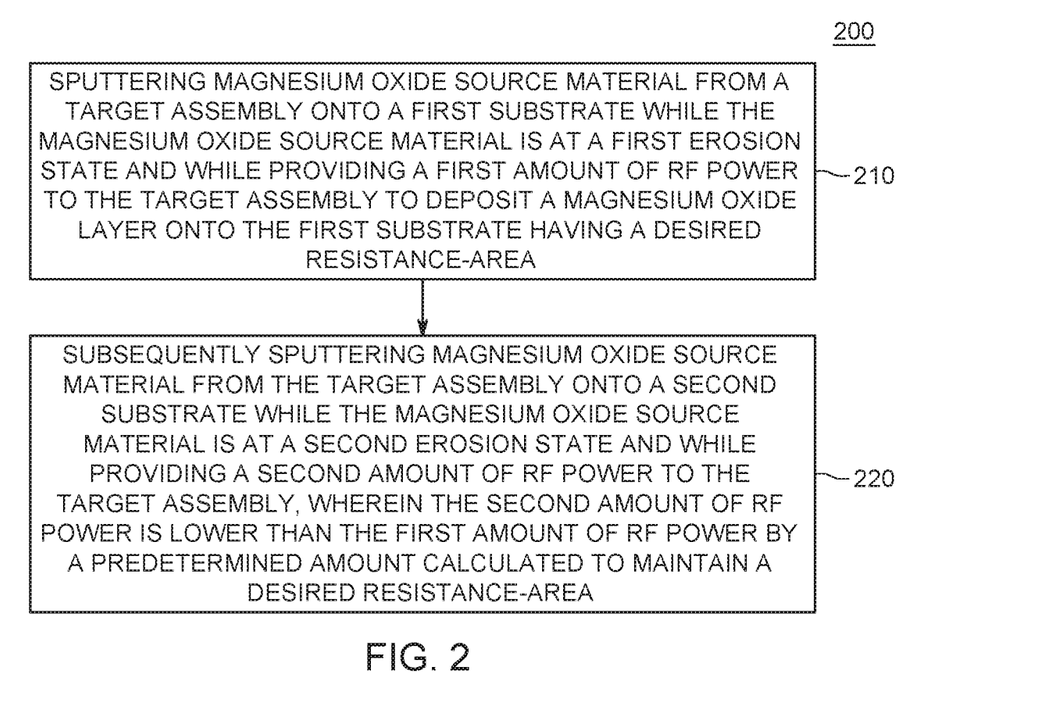
FIG. 2 is a flowchart illustrating a method of depositing a magnesium oxide layer atop one or more substrates in a physical vapor deposition (PVD) chamber.

Referring now to FIG. 2, in embodiments, the present disclosure relates to a method of depositing a magnesium oxide layer atop one or more substrates in a physical vapor deposition (PVD) chamber. Process sequence 200 includes at 210 sputtering magnesium oxide source material from a target assembly onto a first substrate while the magnesium oxide source material is at a first erosion state and while providing a first amount of RF power to the target assembly to deposit a magnesium oxide layer onto the first substrate having a desired resistance-area. Next, process sequence 200 includes at 220 subsequently sputtering magnesium oxide source material from the target assembly onto a second substrate while the magnesium oxide source material is at a second erosion state and while providing a second amount of RF power to the target assembly, wherein the second amount of RF power is lower than the first amount of RF power by a predetermined amount calculated or to maintain a desired resistance-area. In embodiments the predetermined amount is sufficient to maintain a desired resistance-area. In embodiments, the desired resistance-area of the first substrate and second substrate is between 2 and 20 ohm[$\mu m^2$]. In embodiments, the desired resistance-area has a consistency of ±0.2 ohm[$\mu m^2$] throughout the life of a target assembly. In embodiments, the magnesium oxide source material at the first erosion state has not been substantially eroded and wherein the magnesium oxide source material at the second erosion state has been substantially eroded.

In some embodiments, the present disclosure relates to a non-transitory computer readable medium having instructions stored thereon that, when executed, cause a method of depositing a dielectric oxide layer, such as an MGO layer, atop one or more substrates in a physical vapor deposition (PVD) chamber, including: sputtering source material from a target assembly onto a first substrate while the source material is at a first erosion state and while providing a first amount of RF power to the target assembly to deposit a dielectric oxide layer such as MGO onto a first substrate having a desired resistance-area; and subsequently sputtering source material from the target assembly onto a second substrate while the source material is at a second erosion state and while providing a second amount of RF power to the target assembly, wherein the second amount of RF power is lower than the first amount of RF power by a predetermined amount calculated to maintain the desired resistance-area. In embodiments, the source material at the second erosion state is substantially eroded, and wherein source material at the first erosion state is substantially uneroded. In embodiments, the first amount of RF power provided to the target assembly at the first erosion state is decreased at a linear rate to the second amount of RF power provided to the target assembly at the second erosion state. In embodiments, the source material is one of magnesium, magnesium oxide, titanium (Ti), tantalum (Ta), copper (Cu), cobalt (Co), tungsten (W) or aluminum (Al). In embodiments, the first amount of RF power is about 500 W to about 20000 W. In embodiments, the first amount of RF power is decreased by 0.5 to 3 W/kWhr.

Figure 4:
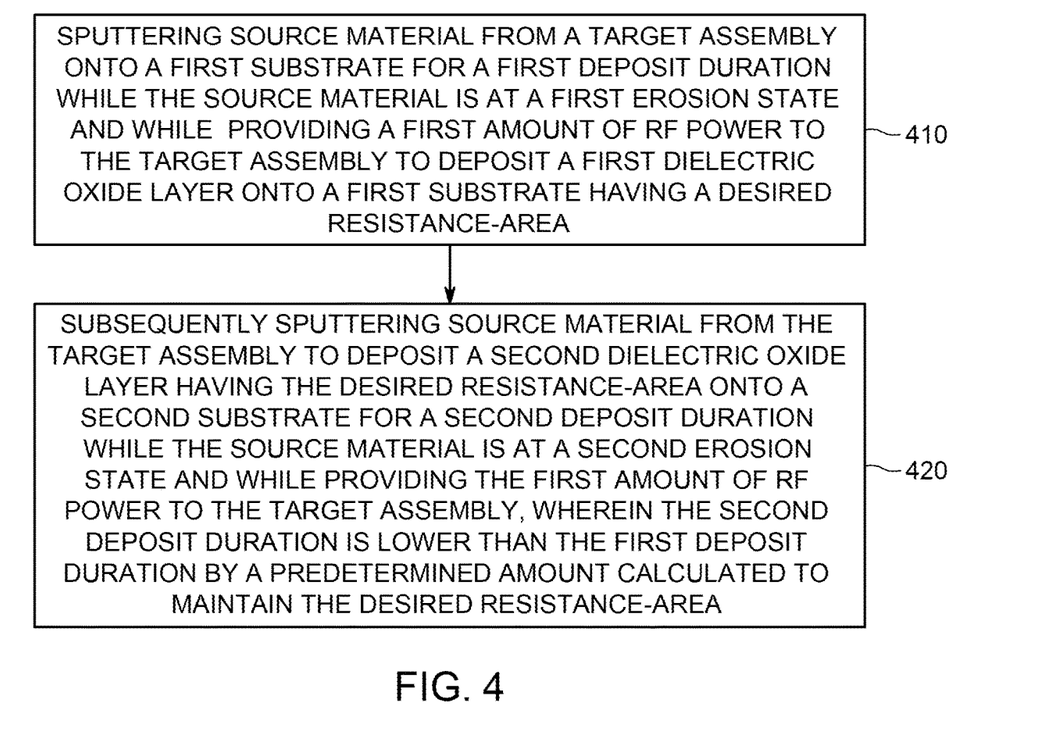
FIG. 4 is a flowchart illustrating a method of depositing a dielectric oxide layer atop one or more substrates in a physical vapor deposition (PVD) chamber in accordance with some embodiments of the present disclosure.

Referring not to FIG. 4, in some embodiments, the present disclosure relates to a method of depositing a dielectric oxide layer atop one or more substrates in a physical vapor deposition (PVD) chamber. Process sequence 400 includes at 410 sputtering source material from a target assembly onto a first substrate for a first deposit duration while the source material is at a first erosion state and while providing a first amount of RF power to the target assembly to deposit a first dielectric oxide layer onto a first substrate having a desired resistance-area. Process sequence 400 includes at 420 subsequently sputtering source material from the target assembly to deposit a second dielectric oxide layer having the desired resistance-area onto a second substrate for a second deposit duration while the source material is at a second erosion state and while providing the first amount of RF power to the target assembly, wherein the second deposit duration is lower than the first deposit duration by a predetermined amount calculated (or sufficient) to maintain the desired resistance-area. In embodiments, the desired resistance-area of the one or more substrates is between 2 and 20 ohm[$\mu m^2$]. In embodiments, the desired resistance-area of the one or more substrates has a consistency of ±0.2 ohm [$\mu m^2$] throughout the life of a target assembly. In embodiments, the predetermined amount is calculated to maintain a desired resistance-area of the one or more substrates over a lifespan of the target assembly. In embodiments, the predetermined amount is calculated to maintain a desired resistance-area of a plurality of substrates over a life of the source material. In embodiments, calculating may include a calculation where a deposition time is not fixed and may be adjusted to compensate for RA in one or more substrates or film stacks made in accordance with the present disclosure. The determination of a second deposit duration may be determined empirically or by modeling. Upon measuring a particular substrate at various times over the life of the target at different adjusted times, RA measurements may be obtained for a linear or substantially linear deposit time (seconds) over the life of a target or 100 kWhr. One of skill in the art may determine a polynomial equation for a particular substrate to calculate the amount of time compensation, or predetermined amount to reduce the first deposit duration sufficient to maintain the desired resistance-area. For example, reduce the deposition duration upon a subsequence substrate such as an MRAM device in accordance with the present disclosure. Accordingly, a plurality of substrates, such as a first and second substrate may be processed through a PVD chamber as described herein and maintain a consistent RA as the target erodes over time. In embodiments, the plurality of substrates are substantially similar such as a batch of substrates or semiconductor devices such as an MRAM device.

In embodiments of process sequence 400, the source material at the second erosion state is partially or substantially eroded. In embodiments, the source material at the first erosion state is substantially uneroded. In embodiments, the first amount of RF power provided to the target assembly at the first erosion state is the same as the first amount of RF power provided to the target assembly at the second erosion state. In embodiments, the source material is one of magnesium, magnesium oxide, titanium (Ti), tantalum (Ta), cobalt (Co), tungsten (W), or aluminum (Al). In embodiments, the source material comprises or consists of magnesium oxide. In embodiments the process sequence includes providing a plasma forming gas comprising one or more of argon (Ar), helium (He), xenon (Xe), neon (Ne), hydrogen ($H_2$), nitrogen ($N_2$), or oxygen ($O_2$) while sputtering source material. In embodiments, the first amount of RF power is about 500 W to about 20000 W. In embodiments, the first amount of RF power is about 800 W, and the first deposit duration is about 49 seconds and the second deposit duration is about 41.5 seconds within 100 kWhr (about 0.075 s/kWhr).

Referring now to FIG. 5, and MRAM film stack such as film stack 502 comprises a tunnel layer 508 deposited atop a magnetic layer such as layer 511. In some embodiments, the tunnel layer 508 comprises a magnetic tunnel junction (MTJ) of an MRAM device and is composed of a nonmagnetic dielectric material such as magnesium oxide (MgO). In embodiments, the tunnel layer 508 has a thickness of about 5-20 angstroms or 5 to 10 angstroms. In some embodiments, the tunnel layer 508 is deposited atop a substrate such as layer 511 via a PVD deposition in accordance with the present disclosure. In embodiments, a metal layer 520 is deposited atop the tunnel layer 508 to form a film stack 525. In embodiments, film stack 525 may optionally include additional layers suitable for inclusion in an MRAM film stack such as layers 503, 505, and 522. In embodiments, film stack 502 is formed from a single target in a PVD chamber in accordance with the present disclosure. In accordance with the present disclosure, the plurality of film stacks such as film stack 502 have a consistent RA. In embodiments, a plurality of film stacks such as film stack 525 are formed from a single target in a PVD chamber in accordance with the present disclosure. In accordance with the present disclosure, the plurality of film stacks such as film stack 525 have a consistent RA and formed over the life of a single target including source material such as MGO.

While the foregoing is directed to embodiments of the present disclosure, other and further embodiments of the disclosure may be devised without departing from the basic scope thereof.

The invention claimed is:

1. A method of depositing a dielectric oxide layer atop one or more substrates in one or more film stacks in a physical vapor deposition (PVD) chamber, comprising:
sputtering source material from a target assembly onto a first substrate while the source material is at a first erosion state and while providing a first amount of RF power to the target assembly to deposit a dielectric oxide layer onto the first substrate having a desired resistance-area; and
subsequently sputtering source material from the target assembly onto a second substrate while the source material is at a second erosion state and while providing a second amount of RF power to the target assembly, wherein the second amount of RF power is lower than the first amount of RF power by a predetermined amount calculated based on resistance-area measurements at different power levels or adjusted times for the first substrate and the second substrate over a lifespan of the target assembly or the source material.

2. The method of claim 1, wherein the predetermined amount is calculated to maintain a desired resistance-area of the one or more film stacks over a lifespan of the target assembly.

3. The method of claim 1, wherein the source material at the second erosion state is partially or substantially eroded.

4. The method of claim 1, wherein the source material at the first erosion state is substantially uneroded.

5. The method of claim 1, wherein the first amount of RF power provided to the target assembly at the first erosion state is decreased at a linear rate to the second amount of RF power provided to the target assembly at the second erosion state.

6. The method of claim 1, wherein the source material is one of magnesium, magnesium oxide, titanium (Ti), tantalum (Ta), cobalt (Co), tungsten (W), or aluminum (Al).

7. The method of claim 1, further comprising providing a plasma forming gas comprising one or more of argon (Ar), helium (He), xenon (Xe), neon (Ne), hydrogen ($H_2$), nitrogen ($N_2$), or oxygen ($O_2$) while sputtering the source material.

8. The method of claim 1, wherein the first amount of RF power is about 500 W to about 20000 W.

9. The method of claim 8, wherein the second amount of RF power is about 1 to 200 W lower than the first amount of RF power.

10. A method of depositing a magnesium oxide layer atop one or more substrates in a physical vapor deposition (PVD) chamber, comprising:
sputtering magnesium oxide source material from a target assembly onto a first substrate while the magnesium oxide source material is at a first erosion state and while providing a first amount of RF power to the target assembly to deposit a magnesium oxide layer onto the first substrate having a desired resistance-area; and
subsequently sputtering magnesium oxide source material from the target assembly onto a second substrate while the magnesium oxide source material is at a second erosion state and while providing a second amount of RF power to the target assembly, wherein the second amount of RF power is lower than the first amount of RF power by a predetermined amount calculated based on resistance-area measurements at different power levels or adjusted times for the first substrate and the second substrate over a lifespan of the target assembly or the magnesium oxide source material.

11. The method of claim 10, wherein the desired resistance-area of the first substrate and second substrate is between 2 and 20 ohm [$\mu m^2$].

12. The method of claim 10, wherein the desired resistance-area has a consistency of ±0.2 ohm [$\mu m^2$] throughout the lifespan of the target assembly.

13. The method of claim 10, wherein the magnesium oxide source material at the first erosion state has not been substantially eroded and wherein the magnesium oxide source material at the second erosion state has been substantially eroded.

14. A method of depositing a dielectric oxide layer atop one or more substrates in a physical vapor deposition (PVD) chamber, comprising:
sputtering source material from a target assembly onto a first substrate for a first deposit duration while the source material is at a first erosion state and while providing RF power to the target assembly to deposit a first dielectric oxide layer onto the first substrate having a desired resistance-area; and
subsequently sputtering source material from the target assembly to deposit a second dielectric oxide layer having the desired resistance-area onto a second substrate for a second deposit duration while the source material is at a second erosion state and while providing RF power to the target assembly, wherein the second deposit duration is lower than the first deposit duration by a predetermined amount calculated based on resistance-area measurements at different power levels or adjusted times for the first substrate and the second substrate over a lifespan of the target assembly or the source material.

15. The method of claim 14, wherein the desired resistance-area of the one or more substrates is between 2 and 20 ohm [$\mu m^2$].

16. The method of claim 14, wherein the desired resistance-area of the one or more substrates has a consistency of ±0.2 ohm [$\mu m^2$] throughout the lifespan of the target assembly.

17. The method of claim 14, wherein the predetermined amount is calculated to maintain a desired resistance-area of the one or more substrates over a lifespan of the target assembly.

18. The method of claim 14, wherein the predetermined amount is calculated to maintain a desired resistance-area of a plurality of substrates over a lifespan of the source material.

19. The method of claim 14, wherein the source material at the second erosion state is partially or substantially eroded.

20. The method of claim 14, wherein the RF power provided to the target assembly at the first erosion state is the same as the RF power provided to the target assembly at the second erosion state.

* * * * *